US010205544B2

(12) United States Patent
Lee et al.

(10) Patent No.: US 10,205,544 B2
(45) Date of Patent: *Feb. 12, 2019

(54) RADIO FREQUENCY SHIELDED ROBOTIC TELECOMMUNICATION DEVICE TESTING PLATFORM

(71) Applicant: T-Mobile USA, Inc., Bellevue, WA (US)

(72) Inventors: Bobby Lee, Bellevue, WA (US); David Ross Jenkinson, Auburn, WA (US)

(73) Assignee: T-Mobile USA, Inc., Bellevue, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/699,501

(22) Filed: Sep. 8, 2017

(65) Prior Publication Data

US 2018/0054265 A1 Feb. 22, 2018

Related U.S. Application Data

(63) Continuation of application No. 15/239,705, filed on Aug. 17, 2016, now Pat. No. 9,774,409.

(51) Int. Cl.
  *H04B 17/30* (2015.01)
  *H04N 7/18* (2006.01)
  *H04N 21/2187* (2011.01)

(52) U.S. Cl.
  CPC ............. *H04B 17/30* (2015.01); *H04N 7/183* (2013.01); *H04N 21/2187* (2013.01)

(58) Field of Classification Search
  CPC ........ H04B 17/00; H04B 17/29; H04B 17/30; G01R 29/0835
  USPC ...................................................... 455/67.11
  See application file for complete search history.

(56) References Cited

U.S. PATENT DOCUMENTS

| 4,962,358 | A | 10/1990 | Svetanoff |
| 5,583,318 | A | 12/1996 | Powell |
| 6,008,636 | A * | 12/1999 | Miller .................... G01R 31/01 324/757.01 |
| 6,657,214 | B1 | 12/2003 | Foegelle |
| 8,761,938 | B2 * | 6/2014 | Jenkinson .............. B25J 9/1697 700/259 |
| 9,283,672 | B1 | 3/2016 | Matthews et al. |

(Continued)

OTHER PUBLICATIONS

PCT Search Report and Written Opinion dated Oct. 13, 2017 for PCT Application No. PCT/US17/42260, 13 pages.

(Continued)

*Primary Examiner* — Simon Nguyen
(74) *Attorney, Agent, or Firm* — Lee & Hayes, PC

(57) ABSTRACT

An RF shield for enclosing a robotic tester unit while testing mobile devices. In some embodiments, the RF shield includes at least two conductive RF shield layers separated by an insulator material. In some embodiments, an inner surface of the RF shield is further lined with a RF absorbing material to absorb EM radiation generated within the RF Shield enclosure. In some embodiments, the internal components required for testing, e.g. the robot, are powered via a power conditioner that removes from the power source frequencies above a threshold, e.g. 100 Hz, to eliminate RF signals absorbed into the power lines via radio towers and/or intentionally induced into the power lines to control power equipment.

20 Claims, 5 Drawing Sheets

(56) References Cited

U.S. PATENT DOCUMENTS

| | | | |
|---|---|---|---|
| 9,774,409 B1* | 9/2017 | Lee | H04B 17/30 |
| 2011/0300809 A1* | 12/2011 | Gordiyenko | H04B 17/23 |
| | | | 455/67.12 |
| 2012/0146956 A1 | 6/2012 | Jenkinson | |
| 2012/0176906 A1 | 7/2012 | Hartenstein et al. | |
| 2012/0236528 A1 | 9/2012 | Le et al. | |
| 2013/0033279 A1* | 2/2013 | Sozanski | G01R 29/0821 |
| | | | 324/750.27 |
| 2013/0093447 A1 | 4/2013 | Nickel et al. | |
| 2013/0257468 A1 | 10/2013 | Mlinarsky | |
| 2014/0055147 A1* | 2/2014 | Haylock | G01R 1/04 |
| | | | 324/602 |
| 2014/0141726 A1* | 5/2014 | Schlub | G01R 29/0857 |
| | | | 455/67.12 |
| 2015/0035541 A1 | 2/2015 | Ou Yang | |
| 2016/0098561 A1 | 4/2016 | Keller et al. | |
| 2016/0192213 A1* | 6/2016 | Diperna | H04B 17/11 |
| | | | 455/425 |

OTHER PUBLICATIONS

Offie action for U.S. Appl. No. 15/239,705, dated Jan. 20, 2017, Lee, et al., "Radio Frequency Shielded Robotic Telecommunication Device Testing Platform", 9 pages.

* cited by examiner

RADIO FREQUENCY SHIELDED ROBOTIC TELECOMMUNICATION DEVICE TESTING PLATFORM

CROSS-REFERENCE TO RELATED APPLICATION

This patent application is a continuation of and claims the benefit of U.S. patent application Ser. No. 15/239,705, filed on Aug. 17, 2016, entitled "RADIO FREQUENCY SHIELDED ROBOTIC TELECOMMUNICATION DEVICE TESTING PLATFORM", which is hereby incorporated in its entirety by reference.

FIELD OF THE DISCLOSURE

The present disclosure relates generally to robotically testing telecommunications devices and, more particularly, it relates to a testing system for performing highly controllable and repeatable testing protocols using a robot enclosed within a radio frequency (RF) shielded enclosure to shield the telecommunications devices from ambient RF signals.

BACKGROUND

The electronics industry is a dynamic industry where new products are continually being released and implemented for use by people and businesses in the marketplace. Many new products include touch screens that enable a user to input commands to an electronic device by touching the screen of the device rather than relying on traditional inputs such as buttons and directional control pads.

Before a product (e.g., device, system, software, and/or hardware) is implemented in the market or made available for consumption, the product often undergoes testing to ensure that the product is fully functional and operational upon deployment. The testing may be used to measure durability, battery performance, application performance, screen sensitivity, or other quantifiable aspects of the operation of the electronic device subjected to the testing.

Traditional testing platforms are configured to test telecommunication devices that have traditional inputs, such as buttons, which have a fixed location on the device. However, with touch screen enabled devices, an application designer may place input controls anywhere within the display screen, which may require user interaction to determine a location of an input control used to perform a desired action. Robotic systems may be useful in providing dynamic testing protocols to robotically simulate user interaction with a telecommunication device. Robotic systems may however, in some instances, exacerbate the issue of ambient radio frequency (RF) energy interfering with a telecommunication device under testing conditions.

BRIEF DESCRIPTION OF THE DRAWINGS

The Detailed Description is set forth with reference to the accompanying figures. In the figures, the left-most digit(s) of a reference number identifies the figure in which the reference number first appears. The use of the same reference numbers in different figures indicates similar or identical items or features.

DETAILED DESCRIPTION

A radio frequency (RF) shielded robotic device testing platform may be used to perform repeatable testing of a device, such as a telecommunications device that includes a touch screen display. During a testing protocol, an RF-shielded robotic device testing platform may initiate various operations of the telecommunication device by engaging a touch screen of the telecommunication device. The operations in the testing protocol may include, without limitation, initiating voice calls, transmitting and receiving data (messages, videos, music, etc.), running applications, and performing other operations. By robotically initiating operations such as those described above with respect to the testing protocol, telecommunication devices may be tested in a laboratory environment using an automated process and include quick cycle times, making the tests relatively inexpensive and repeatable. Results of the testing protocols may be analyzed to determine performance of the telecommunication device, which may be compared to threshold performance metrics or used for other purposes.

The testing protocols may be performed within an RF shielded enclosure which shields the telecommunication device from ambient RF energy that is unassociated with (e.g. not generated because of) the testing protocols and which may potentially interfere with or otherwise affect the results of the testing protocols. The ambient RF energy may include ambient RF signals, e.g. RF signals generated proximate to the testing environment but unassociated with the testing protocol, in addition to non-signal energy, e.g. RF energy resulting from electrical current transfer but that does not carry data such as power transmission current.

During a testing protocol being performed within the RF shielded enclosure, the platform may employ one or more tips to engage the telecommunication device to simulate human interaction with the telecommunication device, e.g. through one or more buttons and/or a touch screen of the telecommunication device. Such tips may include different shapes, sizes, and materials, which may be representative of fingers or objects that humans use to engage the touch screen. By providing for robotic testing of a telecommunications device within the RF shielded enclosure, the platform and methods according to the present disclosure are able to perform testing protocols at a high throughput rate and also in a highly repeatable manner.

It should be understood that although the disclosure describes several examples and related embodiments, the disclosure is not intended to be all-inclusive nor exhaustive in its descriptions. As such, it should be appreciated that the subject matter of the disclosure can be reasonably modified, rearranged, or otherwise altered, to achieve similar results.

Figure 1:
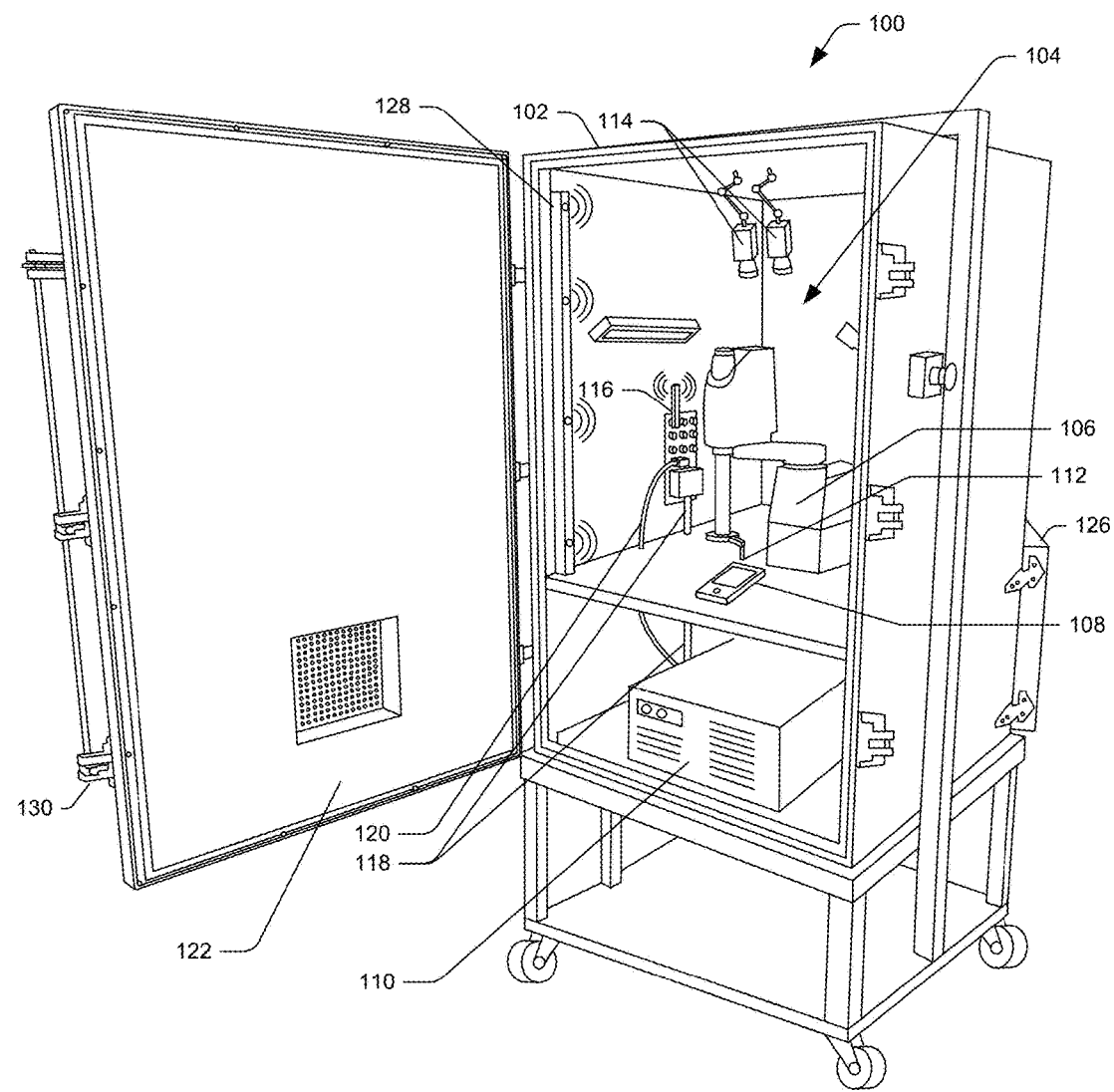
FIG. 1 illustrates an overview of an exemplary radio frequency (RF) shielded robotic testing system, in accordance with various implementations of the disclosure.

FIG. 1 illustrates an overview of an exemplary radio frequency (RF) shielded robotic testing system 100 that includes an RF-shielded enclosure 102 having a plurality of walls defining an interior region 104 thereof. The system 100 includes a robot 106, positioned within the interior region 104, that is configured to provide a telecommunication device 108 with a plurality of testing inputs that are associated with performing a testing protocol to validate various functionalities of the telecommunication device 108 (also referred to herein as device 108). The system 100 also includes at least one controller 110 that may transmit commands (e.g. movement or actuation commands) to the robot 106 and, upon receiving the commands, the robot 106 may operate accordingly by performing an actuation of one or more motors. For example, the robot 106 may execute a movement to cause a tip 112 of a movable arm to engage the device 108, e.g. inputting a command sequence into a touch screen of the device 108, and thereby initiate an operation to be performed by the device 108 (e.g. initiate a telephone call, interact with an application, etc.). In some embodiments, the system 100 may include one or more cameras 114 to capture imagery of the testing of the telecommunications device 108 which may be processed by the controller 110 to generate further actuation commands for causing the robot 106 to dynamically move the tip in response to information displayed by the device 108, e.g. on a screen or touch screen of the device. For example, the system 100 may be configured to recognize certain types of user prompts and/or commands and respond accordingly. In some embodiments, the system 100 may also include one or more light sources (shown directly above the antenna 116 in FIG. 1) in order to illuminate the interior region 104 of the RF-shielded enclosure 102.

As illustrated, the system 100 may include an antenna 116 positioned within the interior region 104 to transmit to and receive from the device 108 RF signals in associated with the testing protocol(s) being performed within the interior region 104 of the system 100. The antenna(s) 116 may be coupled to various end connectors which may protrude from an interior panel within the interior region 104. For example, the interior panel may include one or more SMA (male or female) type connectors and/or one or more QMA type connectors.

The system 100 may also include a power supply 118 which powers the controller 110, the robot 106, or both. For example, in the illustrated embodiment the power supply 118 is shown as being routed to the controller 110 and, in such an embodiment, one or more actuation control cables may be routed from the controller 110 to the robot 106 to transmit actuation commands and/or power to the robot 106. The system 100 may also include a communication channel 120 which enables a user terminal (e.g. shown in FIG. 4) to communicate with one or both of the controller 110 or the robot 106.

In some embodiments, the RF-shielded enclosure 102 may be opened at one or more locations in order to access various portions of the interior region 104. For example, a front door 122 may be pivoted into an open position to provide access to the robot 106 and a testing location that is adjacent to the robot 106, e.g. the device is illustrated in the testing location in FIG. 1, at which the robot 106 may enter commands into device 108 via the tip 112. In some embodiments, the system 100 includes a device fixture configured to secure the device 108 in place during testing. In particular, during a testing protocol the robot 106 may enter numerous different types of commands into the device 108 which may exert forces on the device 108, e.g. performing a swipe across a touch screen of the device may exert a lateral force through friction. Accordingly, the device fixture may secure the device in place to prevent (i) the device from moving and/or (ii) device location data determined during a calibration operation performed by the system from becoming obsolete.

Figure 2:
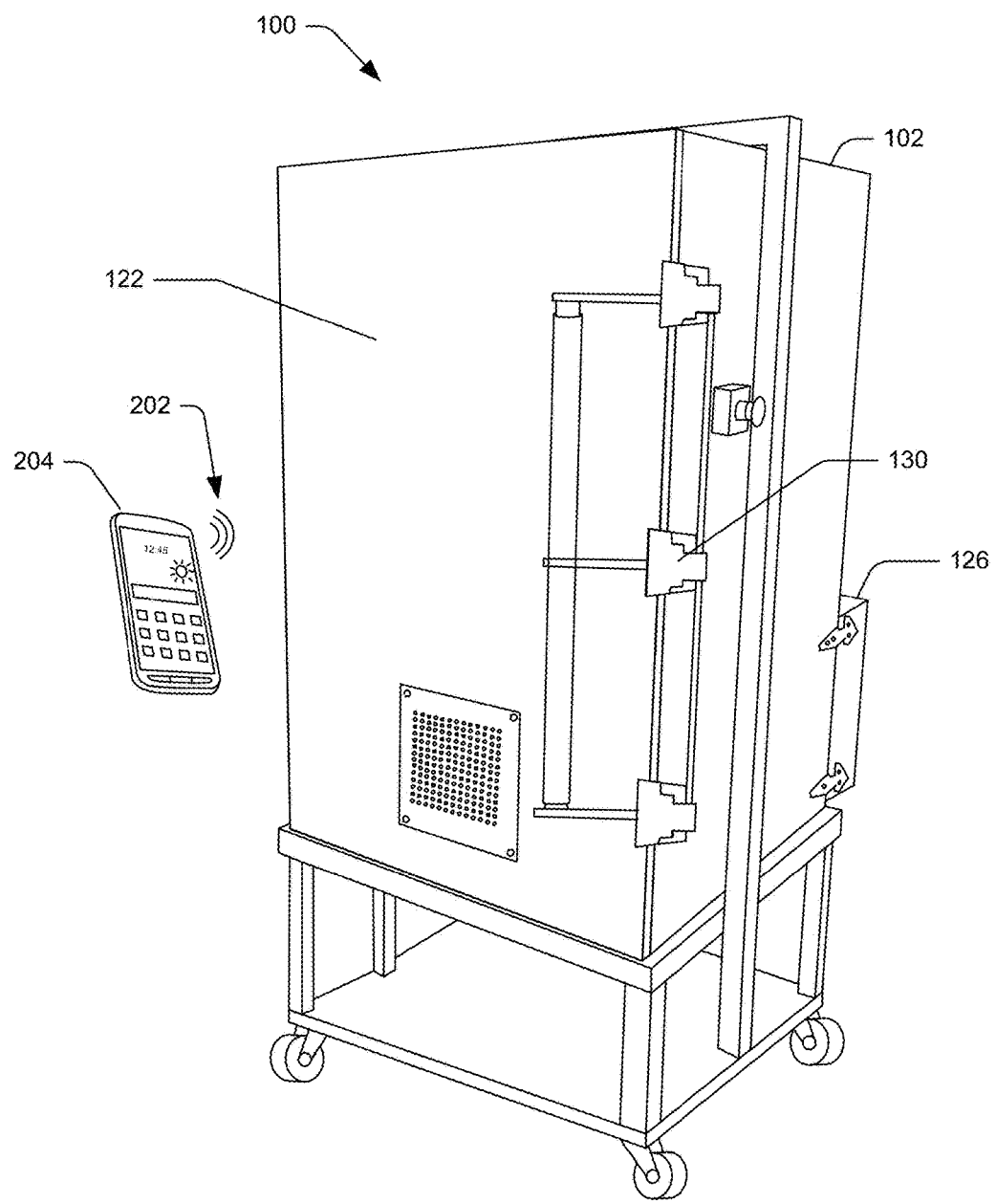
FIG. 2 illustrates the exemplary RF shielded robotic testing system shown in FIG. 1 with doors thereof in closed positions to shield an interior region of the testing system from ambient RF energy.

Referring now to FIG. 2, the front door 122 may be pivoted into a closed position to shield the telecommunication device 108 from ambient RF energy 202 propagating through an exterior region that is outside of the RF-shielded enclosure 102. For example, an electronic device 204 may receive or attempt to transmit data, e.g. receive or send SMS or MMS data, which may result in ambient RF energy 202 being caused to propagate through the environment external but proximate to the RF-shielded enclosure 102, e.g. the external region. In some embodiments, there may be more than one door for accessing different parts of the interior region. For example, the embodiment illustrated in FIGS. 1 and 2 includes a rear door 126 to allow access to a rear panel of the controller 110 and/or the robot 106.

In some embodiments, the system 100 may include one or more sensors 128 to determine whether the RF-shielded enclosure 102 is closed such that the interior region 104 is being shielded from ambient RF energy. In some embodiments, the one or more sensors 128 may also include a light gate type sensor to determine whether an object, e.g. a user's hand, has broken a safety plane in front of the testing location. In response to various conditions sensed by the one or more sensors 128, the system may perform various actions such as, for example, halting movements by the robot to prevent injury to an operator and/or damage to equipment. In some embodiments, the system 100 may include an emergency stop button configured to immediately halt movement of the robot 106.

In some embodiments, the system 100 may respond to a determination that the RF-shielded enclosure 102 has been opened while a testing protocol is being performed by re-running an interrupted operation of the testing protocol. For example, the testing protocol may include ten different operations to be validated and/or benchmarked with respect to the telecommunication device 108. In a situation in which the system has completed testing of three of the ten different operations, and the door 122 is opened while the fourth operation is being benchmarked and/or validated, the system 100 may determine whether it is necessary to re-run the fourth operation of the testing protocol. For example, if the telecommunication device 108 is being validated in a way that simply receiving a passing score, e.g. successfully performing the operation within a predetermined amount of time, constitutes passing the testing protocol then the system 100 may respond to the front door 122 being opened while the fourth operation is being validated by determining whether the telecommunication device 108 passed that portion of the testing protocol. If the fourth operation was timely completed despite the potential interference from ambient RF energy then it may be assumed that the device 108 would also pass without the potential interference and the system 100 may proceed to testing of the fifth operation. In contrast, if the fourth operation failed or was not timely completed then it may be assumed that the potential interference may have affected the outcome of the fourth operation and the system 100 may re-perform the fourth operation with the device 108 being shielded throughout the test. Furthermore, if the telecommunication device 108 is being benchmarked or ranked against other devices in terms of performance then highly controlled and repeatable testing conditions may be desirable. Accordingly, in some embodiments, any breach of environmental controls such as, for example, opening of the RF-shielded enclosure 102 thereby potentially exposing the telecommunication device 108 to ambient RF energy 202 may void the test results and result in the testing protocol being re-performed in part or in whole.

In some embodiments, the system 100 may include an automated locking mechanism 130 that is configured to prevent the RF-shielded enclosure 102 from being inadvertently opened while a testing protocol is being performed. For example, the locking mechanism 130 may be automatically engaged at the initiation of a testing protocol by a user from a user terminal. In some embodiments, the system 100 may be configured to detect whether the locking mechanism 130 is currently engaged and respond by taking various actions such as delaying an initiation of a testing protocol until the locking mechanism is engaged. For example, if a user attempts to initiate a testing protocol when the door 122 is open, the system 100 may then notify the user that the door is ajar and wait until the door is closed and the locking mechanism 130 engaged before initiating the testing protocol.

Figure 3:
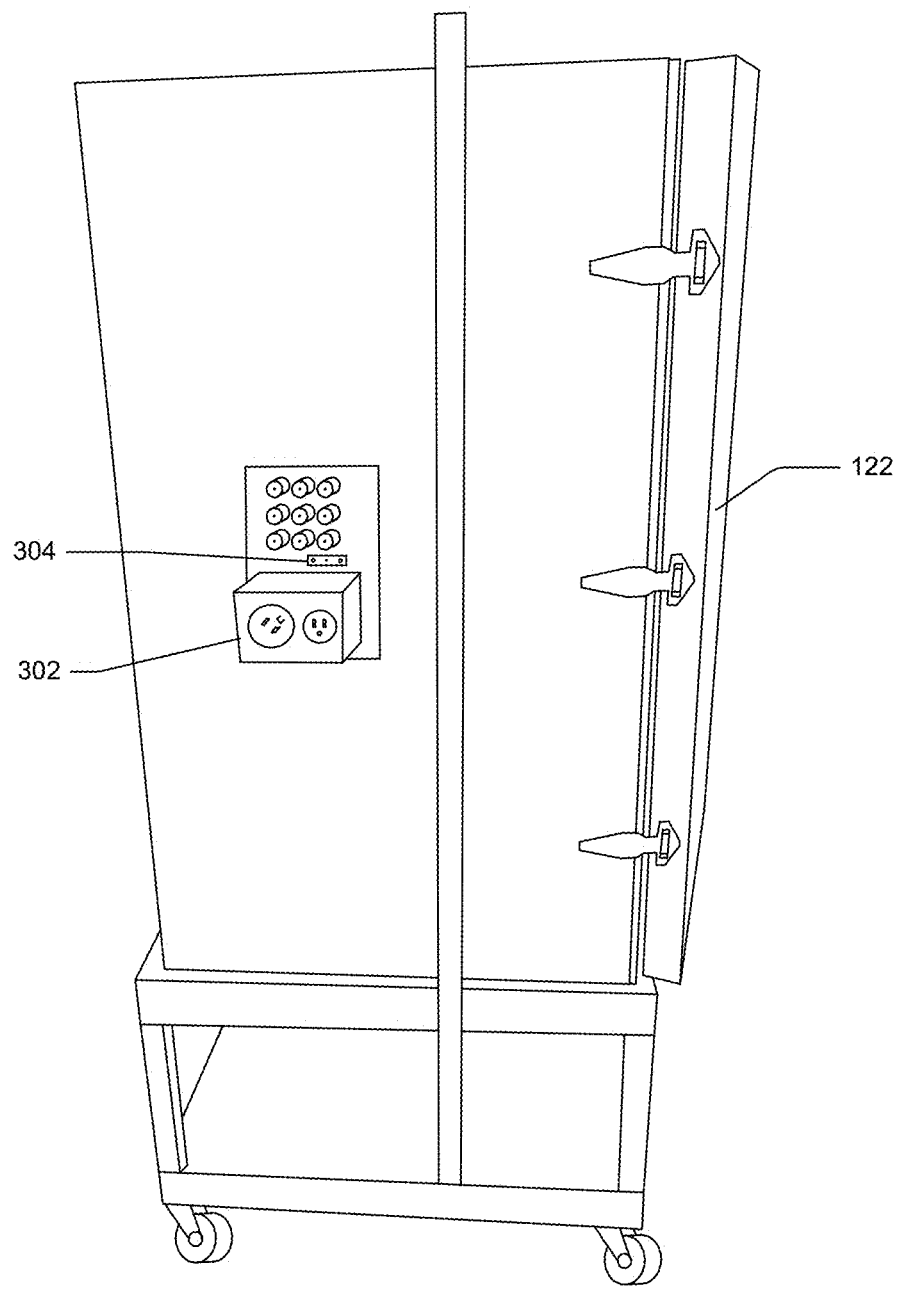
FIG. 3 illustrates a side view of the exemplary RF shielded robotic testing system shown in FIG. 1 that includes various system input ports.

Referring now to FIG. 3, in some embodiments, the system 100 may include various input ports. In some embodiments, the system 100 may include one or more power inputs 302 which may be configured to accept one or more types of power. For example, in the illustrated embodiment the power input 302 includes two power input ports with one being configured to accept 120 volt power and the other being configured to accept 240 volt power. In some embodiments, the system 100 may include one or more communication ports. For example, communication port 304 may enable the communication channel 120 connect to a user terminal. Moreover, the various internal end connectors described and shown with relation to FIG. 1 may each have a corresponding external connection port as shown in FIG. 3. For example, the SMA type connectors may protrude from the interior region to the exterior region.

Figure 4:
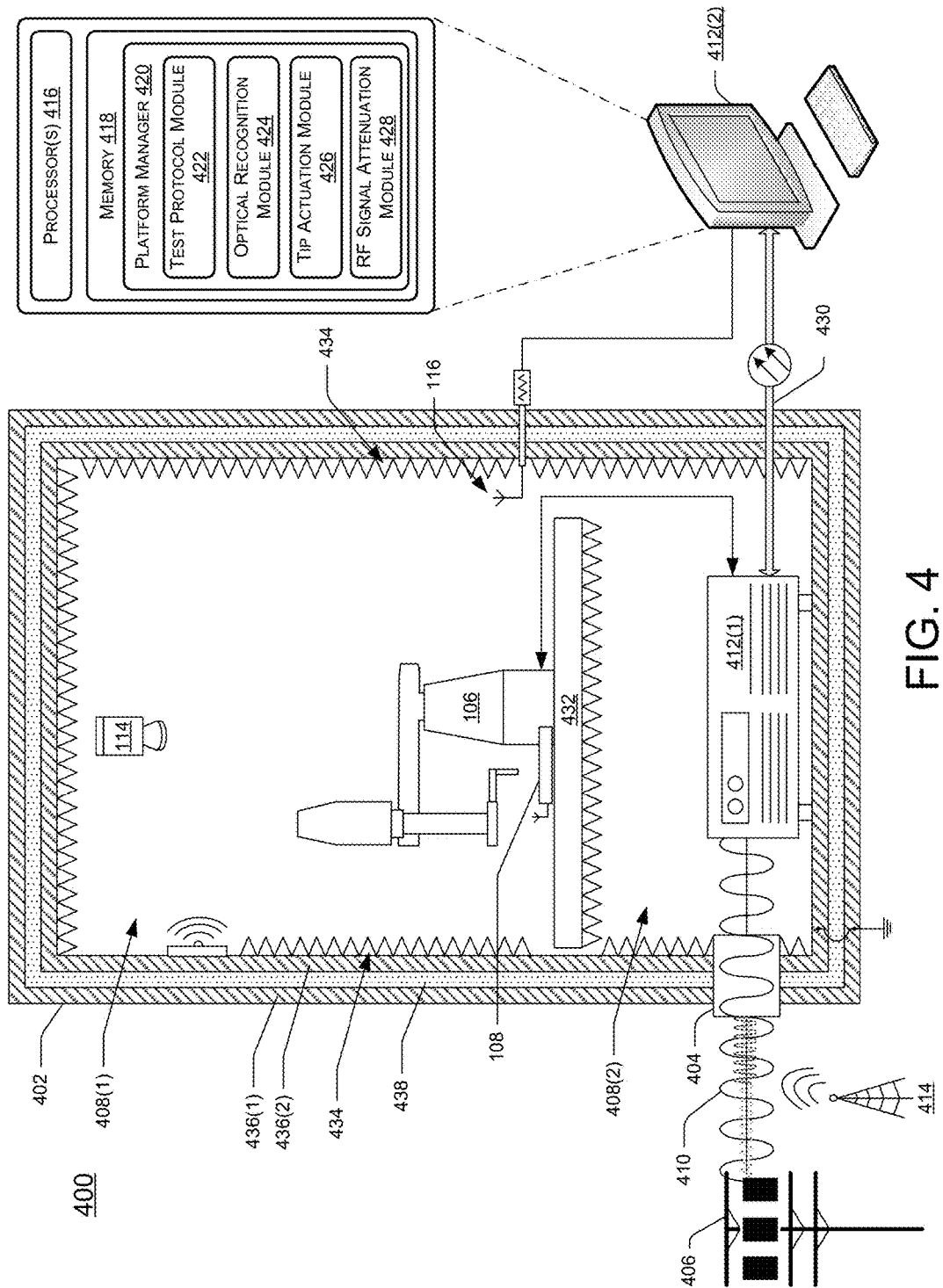
FIG. 4 is an illustrative system including a robot positioned within a multi-layered RF-shielded enclosure, a power conditioner, and a user terminal that is communicatively coupled to an actuation controller positioned within the multi-layered RF-shielded enclosure, in accordance with embodiments of the disclosure.

Referring now to FIG. 4, an illustrative system 400 includes a robot 106 positioned within a multi-layered RF-shielded enclosure 402 and a power conditioner 404 to receive EM energy from a power source 406 and to filter out any portion of the received EM energy which is not optimized for power transmission and which may cause unnecessary interference with tests if passed through to the interior region 408 of the multi-layered RF-shielded enclosure 402. For example, electrical power transmission lines are generally designed to transmit power at 50 Hz or 60 Hz from one location to another location. At these power transmission frequencies a first portion of the EM energy 410 may transmit power very efficiently with little of the EM energy being radiated out of the lines as ambient RF energy which may potentially interfere with testing of the device 108. Therefore, based on this portion of the EM energy being at one of these transmission frequencies, or within a predetermined range around these frequencies, the power conditioner 404 may transmit that portion into the enclosure 402 to power the robot 106 or other internal componentry such as a controller 412.

Other portions of the EM energy may, however, be carried through the power transmission lines at frequencies which the lines were not designed to carry energy at. For example, although typical power transmission lines are not designed to carry RF energy, RF energy nevertheless is often carried through these lines both intentionally and inadvertently. Moreover, the amount of EM energy that is radiated from the lines increases as a function of the frequency of the carrier-current of the energy. In particular, while little of the electrical power being transmitted in the roughly 50 Hz to 60 Hz range will be radiated out of the lines, a signal being carried at 100 kHz will have a great amount of the signal radiated out of the line as RF energy and that radiated amount may be a source of potential interference with testing of the device 108. One example of EM energy which may be carried through the power transmission lines at communication frequencies includes absorbed EM energy that is generated by a radio base station 414, e.g. such as an AM or FM base station or a cellular base station, and absorbed by a power transmission line acting as an antenna. This type of absorbed EM-energy is illustrated in FIG. 4 as the medium gray line of medium amplitude (as compared to the other illustrated waveforms). Another example, of communication frequency EM energy includes Power Line Communication (PLC) data signals such as, for example, those used by the electric-utility industry to send commands to, and thereby control, certain electrical equipment. Generally, PLC commands are transmitted at frequencies less than 490 kHz; however, such frequencies may still radiate a significant portion of the signal out of the line as RF energy and cause interference with surrounding radio equipment such as the telecommunications device 108. This type of PLC data signal energy is illustrated in FIG. 4 as the light gray line of low amplitude (as compared to the other illustrated waveforms).

As illustrated in FIG. 4, the power conditioner 404 may receive EM energy that includes both power transmission frequencies (e.g. 120 volt power alternating at 60 Hz) and also communications frequencies (e.g. PLC signal data or absorbed RF-energy). In order to improve testing conditions within the interior region of the multi-layered RF-shielded enclosure 402, e.g. in terms of lowering potential interference and increasing repeatability of testing conditions, the power conditioner may readily transmit the power transmission frequencies into the enclosure 402, for example, to one or both of the robot 106 or the controller 412. In some embodiments, the power conditioner 404 filters high-frequency energy out of the EM-energy while transmitting low-frequency energy into the RF-shielded enclosure 402 to power internal componentry. High-frequency energy may be defined as energy above a predetermined frequency threshold while low-frequency energy may be defined as energy below the predetermined threshold. For example, any EM energy above/below 100 Hz (or 60 Hz for that matter) may be defined as high-frequency/low-frequency energy, respectively.

As illustrated in FIG. 4, the controller 412 may be equipped with one or more processor(s) 416 and memory 418. The memory 418 may include applications, modules, and/or data. In some embodiments, the memory 418 may include a platform manager 420 to interact with the robotic device tester 106. The platform manager 420 may include a test protocol module 422, an optical recognition module 424, a tip actuation module 426, and an RF signal attenuation module 428, among other possible modules that enable the controller 412 to interact with the robotic device tester 106 and the one or more antennas 116, and thereby perform test scenarios on the device 108.

The test protocol module 422 may generate and transmit instructions that control movements of the robotic device tester 106, which performs one or more tests by interacting with the telecommunications device 108. The test protocol module 422 may provide instructions to perform stress testing, repetitive testing, performance testing (e.g., speed, battery life, etc.), screen sensitivity testing, or other types of testing.

The optical recognition module 424 may identify imagery rendered by a touch screen display of the device 108. The optical recognition module 424 may convert the imagery into text using optical character recognition (OCR). In some embodiments, the optical recognition module 424 may also identify various objects, such as virtual buttons, links, or commands that are displayed by the touch screen device and may be interacted with using the robotic device tester 106. In some embodiments, the system 400 may include one or more cameras 114. The camera(s) 114 may be connected to the controller 412, which may store the imagery and perform image processing such as via the optical recognition module 424. The optical recognition module 424 may analyze recorded imagery, which may be used by the platform manager 420 during selection of a subsequent instruction to be performed by the robot 106. The camera 114 may be capable of recording still images, moving images (video), or both. In some embodiments, multiple cameras may be implemented with the robot 106 to record imagery from various angles, perspective, and so forth. In some embodiments, the robot 106 may include other sensors that can sense, measure, and/or record feedback from the touch screen device, such as a sensor that can detect haptic feedback from the touch screen device. In some instances, the controller may use object recognition to determine content and/or commands rendered on the touch screen by a device. For example, the object recognition may determine a display of a notification message and associated commands such as "cancel" or "okay" that enable continued operation of the device.

The tip actuation module 426 may select and move tips to engage the touch screen display of the device 108. The tips may be synthetic pads (e.g., rubberized, plastic, etc.), that are moveably controlled by the robotic device tester 106 to engage a touch screen display in accordance with instructions from the test protocol module 422. In some embodiments, the tip actuation module 426 may select a tip from multiple available tips. In various embodiments, the tip actuation module 426 may be used to controllably perform multi-touch operations on the device 108 by moving two or more tips that simultaneously engage the touch screen display.

The RF signal attenuation module 428 may be configured to enable wireless communication of test signals to the telecommunications device 108 during the testing protocol. The RF signal attenuation module 428 may be coupled to the antenna(a) 116 through one or more of the end connectors shown in FIGS. 1 and 3, e.g. the SMA type end connectors, to enable the signal attenuation module 428 to function as an RF base station for testing one or more of the functionalities or features of the telecommunications device 108 under test. In some embodiments, the system 400 includes multiple antennas—individual ones of which are configured for communication via one or more different protocols, e.g. one antenna to communicate via 4G technology and one antenna to communicate via 3G technology and yet another to communicate via WiFi®. In some embodiments, the RF signal attenuation module 428 may work in unison with the test protocol module 422 and/or the tip actuation module 426 to robotically instruct the telecommunication device 108, e.g. via one or more commands input into a touch screen of the device 108, to simultaneously communicate via more than one communication technology (e.g. simultaneously upload media data via a WiFi® while enabling a voice call via 4G).

Furthermore, the controller 412 may include multiple components with some inside and some outside of the enclosure 402. In some embodiments, the controller may include both an actuation controller 412(1) for transmitting commands to the robot 106 and a user terminal 412(2) for displaying information associated with the robotic testing. In accordance with various embodiments, the user terminal 412(2) may include a monitor, which may display a user interface (UI) to enable the user to interact with the various modules of the platform manager 420. In accordance with some embodiments, the system 400 may be configured to display on a GUI, e.g. the monitor of user terminal 412(2), a substantially live imagery feed received from the camera 114 while testing is being performed within the RF-shielded enclosure during the performing the testing protocol.

The actuation controller 412(2) may be positioned either interior to or exterior to the enclosure 402. In some embodiments, the actuation controller 412(2) is positioned within the interior region 408 of the multi-layered RF-shielded enclosure 402 and is communicatively coupled to the user terminal 412(1) via a communication channel 430. The communication channel 430 may be an optical fiber (e.g. as depicted in FIG. 4) in order to limit the electrical signal current transmitted within the interior region 408. In particular, transmitting information as pulses of light does not emit RF radiation nor is it susceptible to data corruption from RF interference. In some embodiments, the communication channel 430 may include a conductive wire type connection, e.g. a wire configured to transmit data via electric pulses such as a USB cable, or a wireless communication link between an RF antenna within the internal region 408 and the actuation controller 412(2).

In some embodiments, the internal region 408 may include multiple sub-regions separated by partition(s) 432. For example, the embodiment illustrated in FIG. 4 includes a first sub-region 408(1) and a second sub-region 408(2) that are separated by partition 432 which, as illustrated, also provides structural support to the robot 106. The partition 432 may separate the testing location, e.g. where the device 108 is located during the testing protocols, from the location of the actuation controller 412(2). In some embodiments, the actuation controller 412(2) coupled to the robot 106 via an actuation-line, which provides power and commands to the robot, through a passageway between the first and second sub-regions. Accordingly, in some embodiments, sub-regions are not entirely separated but rather are at least partially separated, e.g. by a partition or RF baffle. In some embodiments, one or both of the first and second sub-region may be lined with an RF absorbing material 434 to minimize internal reflection of RF energy within the interior region, e.g. RF energy which penetrated the enclosure and/or RF energy generated internal to the enclosure such as by the device 108 or actuation controller 412(2). Exemplary RF absorbing materials include, but are not limited to, ferrite-loaded rubber and/or carbon-loaded foam. Furthermore, in various embodiments, the RF absorbing material 434 may include numerous peaks to form and egg-crate type shape to further assist in scattering and dissipating internal RF energy.

In some embodiments, the multi-layered shielded enclosure 402 may include two or more conductive layers 436 for providing suitable isolation at relevant frequencies. Conductive layers 436 may be made from any material suitable for shielding the relevant frequencies of RF energy such as, for example, aluminum, copper, or steel. Furthermore, the conductive layers 436 may designed to provide substantial shielding effectiveness such as, e.g. higher than 60 dB or higher than 80 dB. In some embodiments, the conductive layers 436 may be flexible in nature (as opposed to rigid) such as a cloth material embedded with stainless steel as the RF carrier material used to absorb and/or shield RF energy. In some embodiments, the conductive layers 436 may be a solid metallic sheet material, e.g. a aluminum sheet metal. In some embodiments, the conductive materials 436 may be separated by an insulator 438 such as, for example, a non-conductive foam or an air gap. In some embodiments, the conductive materials 436 may be connected to a ground path to enable dissipation of any absorbed energy.

Figure 5:
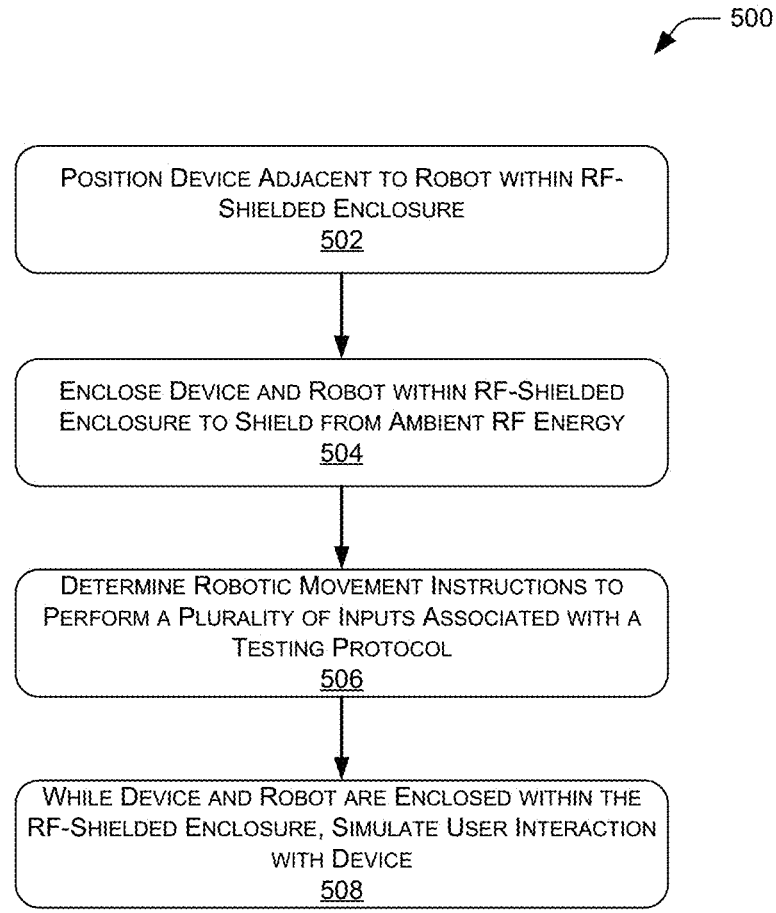
FIG. 5 is a flow diagram of an illustrative process to robotically simulate user interactions with a telecommunications device while the telecommunications device is securely enclosed within an RF-shielded enclosure, in accordance with embodiments of the disclosure.

FIG. 5 is a flow diagram of an illustrative process to robotically simulate user interactions with a telecommunications device while the telecommunications device is securely enclosed within an RF-Shielded Enclosure, in accordance with embodiments of the disclosure.

At block 502, a device is placed at a testing location that is adjacent to a robot within an interior region of an RF-Shielded enclosure. In some embodiments, the testing location includes a fixture to which the device may be secured to prevent to the robot from inadvertently moving the device. For example, the robot may be configured to move a tip, e.g. a tip that simulates a fingertip of a user, into contact with a touch screen of the telecommunication device and, depending on the type of contact, the robot may shift the device's location absent the fixture.

At block 504, the telecommunication device and the robot may be enclosed within the RF-shielded enclosure to shield each, and in particular the telecommunication device, from ambient RF energy propagating through the environment external to the RF-Shielded enclosure. For example, a test engineer's cellular device may receive a phone call transmission while the telecommunication device is within the RF-Shielded enclosure and, in such a situation, the enclosure may shield the telecommunication device from the RF energy transmitted or received by the engineer's cellular device. In some implementations, block 504 may also entail filtering certain portions of EM energy out of energy supplied by a power source. For example, high frequency energy typically used to communicate data from one point to another may be filtered out of a power supply of energy. Low frequency energy typical of power transmission may, however, be allowed to pass to inside of the RF-shielded enclosure to power internal componentry such as, for example, the robot itself and/or an actuation controller communicatively coupled thereto.

At block 506, a testing protocol may be determined that includes instructions to provide testing inputs into the telecommunication device. For example, the testing protocol may relate to validating SMS and/or video call functionality of the telecommunication device.

At block 508, the robot may be caused to execute the instructions to provide the testing inputs to the telecommunication device while both of the device and the robot are enclosed within the RF-shielded enclosure and, therefore, are substantially shielded from ambient RF energy that is external to the enclosure. In some implementations, the robot is configured to mimic one or more human fingers inputting user commands into a touch screen of the telecommunication device within the shielded interior region of the enclosure.

Although the subject matter has been described in language specific to structural features and/or methodological acts, it is to be understood that the subject matter defined in the appended claims is not necessarily limited to the specific structural features or acts described. Rather, the specific structural features and acts are disclosed as exemplary forms of implementing the claims. The scope of the present disclosure and appended claims is not limited by these exemplary forms. In particular, numerous variations, whether explicitly provided for by the specification or implied by the specification, such as variations in structure features and/or methodological acts, whether now known in the art or subsequently developed, may be implemented by one of skill in the art in view of this disclosure.

What is claimed is:

1. A radio frequency (RF) shielded robotic testing system comprising:
    an RF-shielded enclosure configured to shield a telecommunications device that is within an interior region of the RF-shielded enclosure from ambient RF energy propagating through an exterior region that is outside of the RF-shielded enclosure;
    a robot positioned within a first sub-region of the interior region of the RF-shielded enclosure, the robot being configured to move a tip that is configured to engage a touch screen of the telecommunications device thereby providing, to the telecommunications device, a plurality of testing inputs associated with performing a testing protocol to validate one or more functionalities of the telecommunications device;
    an RF antenna positioned within the first sub-region of the interior region of the RF-shielded enclosure, the RF antenna being configured to enable wireless communication with the telecommunication device during the testing protocol;
    an actuation controller positioned within a second sub-region of the interior region of the RF-shielded enclosure that is at least partially separated from the first sub-region by a partition, the actuation controller being configured to provide commands that control the robot's movement of the tip with respect to the touch screen, the movement of the tip simulating, within the interior region of the RF-shielded enclosure, user interactions with the touch screen to cause the telecommunications device to perform the one or more functionalities; and
    a user terminal positioned at the exterior region that is outside of the RF-shielded enclosure, the user terminal communicatively coupled with the actuation controller and the RF antenna, wherein the user terminal and the actuation controller are communicatively coupled by an optical fiber that passes between the interior region and the exterior region.

2. The RF-shielded robotic testing system of claim 1, further comprising a power conditioner configured to receive electromagnetic (EM) energy from a power source, the EM-energy including at least power transmission frequencies and communications frequencies, the power conditioner being configured to transmit the power transmission frequencies from the exterior region to the robot and/or the actuation controller within the interior region of the RF-shielded enclosure and to prevent transmission of the communications frequencies from the exterior region to the interior region of the RF-shielded enclosure.

3. The RF-shielded robotic testing system of claim 2, wherein the communications frequencies include Power Line Communication (PLC) data signals, or absorbed RF-energy that is initially generated by a radio base station and absorbed by a power transmission line, or both.

4. The RF-shielded robotic testing system of claim 2, wherein the power conditioner is configured to filter high-frequency energy that is above a predetermined threshold out of the EM-energy and to transmit low-frequency energy that is below the predetermined threshold to the interior region of the RF-shielded enclosure.

5. The RF-shielded robotic testing system of claim 1, further comprising at least one camera positioned within the interior region of the RF-shielded enclosure, the at least one camera being communicatively coupled with the user terminal and being configured to record imagery rendered, by the telecommunications device, in response to the plurality of testing inputs.

6. The RF-shielded robotic testing system of claim 5, wherein the user terminal comprises at least one display configured to display a substantially live imagery feed received from the at least one camera during the performing the testing protocol.

7. The RF-shielded robotic testing system of claim 5, wherein the user terminal performs optical recognition on imagery received from the at least one camera to recognize at least one of text or inputs displayed on the touch screen of the telecommunication device, and in response provide instructions to the actuation controller to cause the tip to move to simulate the user interactions based at least in part on the at least one of the text or inputs displayed on the touch screen.

8. The RF-shielded robotic testing system of claim 1, wherein at least the second sub-region is at least partially lined with an RF absorbing material.

9. A method comprising:
placing a telecommunications device at a testing location within a first sub-region of an interior region of an RF-shielded enclosure adjacent to a robot positioned within the first sub-region that is configured to move at least one tip into contact with a touch screen of the telecommunications device based on movement instructions received from an actuation controller, the actuation controller being positioned within a second sub-region of the interior region that is separated from the first sub-region by a partition;
enclosing the telecommunication device and the robot within the RF-shielded enclosure to shield the telecommunication device from ambient RF energy propagating through an exterior region that is outside of the RF-shielded enclosure;
determining a testing protocol at a user terminal positioned at the exterior region that is outside of the RF-shielded enclosure, and communicating the testing protocol from the user terminal to the actuation controller through an optical fiber that passes between the interior region and the exterior region; and
while the telecommunications device and the robot are enclosed within the RF-shielded enclosure, instructing the robot with the actuation controller based on the testing protocol to cause the robot to move the least one tip into contact with the touch screen to provide the plurality of testing inputs, thereby simulating user interactions with the touch screen of the telecommunications device.

10. The method as recited in claim 9, further comprising locking a door of the RF-shielded enclosure during performance of the testing protocol to prevent the RF-shielded enclosure from being opened.

11. The method as recited in claim 9, wherein a body of the RF-shielded enclosure that surrounds the interior region comprises a first conductive layer, a second conductive layer, and an insulator layer that at least partially separates the first conductive layer and the second conductive layer.

12. The method as recited in claim 9, wherein the actuator controller or the robot converts the testing protocol received through the optical fiber from the user terminal from at least one optical signal into a corresponding electrical signal to control a performance of the robot during one or more tests based on the testing protocol.

13. The method as recited in claim 9, further comprising receiving, by the user terminal from a camera that is mounted within the interior region of the RF-shielded enclosure, imagery rendered by the telecommunication device during the simulating the user interactions.

14. The method as recited in claim 13, further comprising:
transmitting an imagery feed from the camera that is mounted within the interior region of the RF-shielded enclosure to a display of the user terminal that is positioned at the exterior region; and
displaying the imagery feed on the display while the testing protocol is being performed within the RF-shielded enclosure.

15. The method as recited in claim 9, further comprising:
receiving, at the exterior region, electromagnetic (EM) energy from a power source;
based on a first portion of the EM-energy being within a power transmission frequency range, transmitting the first portion of the EM-energy to at least one of the robot or the actuation controller that is positioned within the interior region of the RF-shielded enclosure; and
based on a second portion of the EM-energy being outside the power transmission frequency range, preventing the second portion of the EM-energy from entering the interior region of the RF-shielded enclosure.

16. The method as recited in claim 9, further comprising:
in response to determining that a door of the RF-shielded enclosure is opened during the testing protocol, causing the robot to re-execute at least some of the instructions thereby re-simulating the user interactions with the touch screen of the telecommunications device.

17. An apparatus comprising:
a multi-layer RF-shielded enclosure including a first conductive layer that is at least partially separated from a second conductive layer by an insulator layer, the multi-layer RF-shielded enclosure being configured to shield a device from ambient RF energy propagating outside of the multi-layer RF-shielded enclosure;
a robot positioned within a first sub-region of an interior region of the multi-layer RF-shielded enclosure, the robot being configured to move at least one tip to provide, to the device, a plurality of testing inputs associated with performing a testing protocol to validate one or more functionalities of the device;
an RF antenna positioned within the first sub-region of the interior region of the multi-layer RF-shielded enclosure that is configured to enable wireless communication with the device during the testing protocol; and
an actuation controller positioned within a second sub-region of the interior region of the multi-layer RF-shielded enclosure that is at least partially separated from the first sub-region by a partition, the actuation controller being communicatively coupled with the robot and being configured to provide the robot with instructions based on the testing protocol to control movement of the at least one tip to simulate user interactions with the device within the multi-layer RF-shielded enclosure, wherein at least the second sub-region is at least partially lined with an RF absorbing material.

18. The apparatus of claim 17, further comprising a light gate configured to detect whether an object has entered the multi-layer RF-shielded enclosure, wherein the actuation controller is configured to prevent movement of the robot based on an object having entered the multi-layer RF-shielded enclosure.

19. The apparatus of claim 17, further comprising an automatic locking mechanism configured to cause a door of the multi-layer RF-shielded enclosure to be securely locked during the testing protocol.

20. The apparatus of claim 17, wherein at least one of the first conductive layer and the second conductive layer are electrically coupled to a grounding wire.

* * * * *